United States Patent
Galloway et al.

(10) Patent No.: US 7,541,880 B2
(45) Date of Patent: Jun. 2, 2009

(54) CIRCUIT AND METHOD FOR GLITCH CORRECTION

(75) Inventors: Brian Jeffrey Galloway, Hoschton, GA (US); Daniel Hillman, San Jose, CA (US)

(73) Assignee: Mosaid Technologies Corporation, Santa Clara, CA (US)

(*) Notice: Subject to any disclaimer, the term of this patent is extended or adjusted under 35 U.S.C. 154(b) by 33 days.

(21) Appl. No.: 11/946,767

(22) Filed: Nov. 28, 2007

(65) Prior Publication Data
US 2008/0258835 A1   Oct. 23, 2008

Related U.S. Application Data

(60) Provisional application No. 60/912,310, filed on Apr. 17, 2007.

(51) Int. Cl.
*H03L 7/18* (2006.01)
*H04B 7/00* (2006.01)

(52) U.S. Cl. .................. 331/16; 331/1 A; 375/376; 455/260

(58) Field of Classification Search .............. 331/1 A, 331/16, 18, 25; 327/156–159; 332/127; 360/51; 375/376; 455/260
See application file for complete search history.

(56) References Cited

U.S. PATENT DOCUMENTS

| | | | |
|---|---|---|---|
| 4,965,531 A | 10/1990 | Riley | |
| 6,630,868 B2 | 10/2003 | Perrott et al. | |
| 6,987,424 B1 | 1/2006 | Hein | |
| 7,098,754 B2 | 8/2006 | Humphreys et al. | |
| 7,298,218 B2 * | 11/2007 | Ghazali et al. | ........ 331/16 |

OTHER PUBLICATIONS

Sudhakar Pamarti, Lars Jansson, Ian Galton; A Wideband 2.4-GHz Delta-Sigma Fractional-N PLL With 1-Mb/s In-Loop Modulation; IEEE Jounal of Solid-State Circuits; Jan. 2004; pp. 49-62; vol. 39. No. 1.

Li Zhang, Jinke Yao, Ende Wu, Baoyong Chi, Zhihua Wang and Hongyi Chen; A CMOS Fully Differential $\Sigma$—$\Delta$ Frequency Synthesizer for 2-Mb/s GMSK Modulation; 2005; pp. 6-9; IEEE in Cooperation with University of Waterloo.

(Continued)

*Primary Examiner*—David Mis
(74) *Attorney, Agent, or Firm*—Dennis R. Haszko

(57) ABSTRACT

Correction of glitches output from a delta-sigma modulator is accomplished using an integer boundary crossing detector and a FIR filter. The detector monitors a portion of an input to the modulator. The detector recognizes a transition from an all 1's bit pattern to an all 0's bit pattern or vice versa as representative of potential for a glitch to be present on the output of the modulator. The detector responsively generates condition detection output. Receipt of such condition detection output triggers the generation of a correction signal by the filter. The correction signal is, at least substantially similar, in magnitude but opposite in sign from to the expected glitch at the output of the modulator. The correction signal is added to the output of the modulator to substantially eliminate the glitch.

16 Claims, 12 Drawing Sheets

OTHER PUBLICATIONS

Wei-Tan Chen, Jen-Chien Hsu, Hong-Wen Lune and Chau-Chi Su; A Spread Spectrum Clock Generator for SATA-II; 2005; pp. 2643-2646; IEEE.

Deok-Soo Kim and Deog-Kyoon Jeong; A Spread Spectrum Clock Generation PLL with Dual-tone Modulation Profile; Symposium on VLSI Circuits Digest of Technical Papers; 2005; pp. 96-99.

Fractional/Integer-N PLL Basics; Technical Brief SWRA029; Texas Instruments Incorporated; Aug. 1999; pp. 1-55.

Andy Howard; Delta-Sigma Modulator PLLs With Dithered Divide-Ratio, Agilent EEsof EDA; http://eesof.tm.agilent.com/pdf/HF_TechNote_110201.pdf; 2001; pp. 1-12.

* cited by examiner

| 572A | 572B | 611A | 611B | 621 | 631 | 641 | 651 | 582A | 582B |
|------|------|------|------|-----|-----|-----|-----|------|------|
| 0 | 0 | 0 | 0 | 1 | 0 | 0 | 1 | 0 | 0 |
| 0 | 0 | 0 | 1 | 0 | 0 | 0 | 1 | 0 | 0 |
| 0 | 0 | 1 | 0 | 0 | 0 | 0 | 1 | 0 | 0 |
| 0 | 1 | 1 | 1 | 1 | 0 | 1 | 1 | 0 | 1 |
| 0 | 1 | 0 | 0 | 0 | 0 | 0 | 0 | 0 | 0 |
| 0 | 1 | 0 | 1 | 0 | 0 | 1 | 0 | 0 | 0 |
| 0 | 0 | 1 | 0 | 1 | 0 | 0 | 0 | 0 | 0 |
| 1 | 0 | 0 | 1 | 0 | 0 | 0 | 0 | 0 | 0 |
| 1 | 0 | 1 | 0 | 0 | 1 | 1 | 0 | 0 | 0 |
| 1 | 1 | 0 | 1 | 1 | 1 | 0 | 0 | 1 | 0 |
| 1 | 1 | 0 | 0 | 0 | 1 | 0 | 0 | 0 | 0 |
| 1 | 1 | 1 | 1 | 0 | 1 | 1 | 0 | 0 | 0 |

FIG. 7

CIRCUIT AND METHOD FOR GLITCH CORRECTION

RELATED APPLICATIONS

The present application claims priority from U.S. provisional Patent Application No. 60/912,310, filed Apr. 17, 2007, which is incorporated herein by reference in its entirety.

BACKGROUND

Wireless communications systems are not presently capable of directly processing and generating radio frequency (RF) signals. Accordingly, wireless communication system designs will continue to employ traditional RF engineering techniques of down-converting from RF to baseband, and/or techniques of down-converting from RF to intermediate frequency (IF) signals, for processing and up-converting the processed signals for transmission.

In wireless transceivers, a wide range of frequencies may be used. In order to perform the down-conversion and/or up-conversion operations, stable and accurate frequency sources, such as crystal oscillators, are employed.

Although there exist a variety of frequency synthesis techniques, the use of phase locked loops (PLLs) remains the primary frequency synthesis methodology in wireless communications. PLLs perform frequency multiplication to generate a desired output frequency as a multiple of a reference frequency through negative feedback techniques.

Currently, most, if not all, of the PLL functionality may be implemented on a single integrated circuit (IC). Modern PLL ICs are highly integrated digital and mixed signal circuits. It is beneficial if such ICs operate on low supply voltages and consume very low power. The wide frequency range employed by modern communications transceivers may be achieved by such ICs, together with an external crystal reference, a (typically off-chip) voltage controlled oscillator (VCO) and optional external passive components.

A fractional-N PLL structure has a number of components in common with a conventional integer-N PLL structure, namely a divider circuit, a phase frequency detector (PFD), a loop filter, an amplifier and a VCO. However, the "divide by integer N" circuit, present in the conventional integer-N PLL structure, is augmented, in a fractional-N PLL structure, by a modulator, which provides the divide by integer N circuit with a divisor signal.

In a digital implementation of a fractional-N PLL structure, the modulator is implemented with an accumulator. In one implementation, known as a delta-sigma (Δ-Σ) modulator or DSM, the modulator comprises an accumulator, an integer module, a modulus module and a summer.

It should be appreciated that DSM circuitry is relatively recent technology with room for improvement.

SUMMARY

A simple integer boundary detection circuit and a finite impulse response (FIR) filter act in conjunction with the DSM circuitry to provide enhancements to the operation of a fractional-N PLL. The integer boundary detection circuit efficiently detects when an integer boundary has been crossed in an input signal to the DSM circuitry and applies an appropriate adjustment to a divisor signal output from the DSM circuitry only when an integer boundary has been crossed. By doing so, the filter counteracts glitches that may be generated by the DSM circuitry responsive to the crossing of the integer boundary. In effect, the step response of the DSM circuitry is approximated and corrected for using a FIR filter fed by the integer crossing detection circuit.

The integer boundary detection circuit first examines a portion of the desired divisor value being presented to the DSM. In one embodiment, when the circuit detects that the desired divisor value has crossed an integer boundary in a positive direction, a positive pulse is forwarded to the FIR filter. The output of the FIR filter is subtracted from the DSM output and the resulting corrected divisor signal is presented to the divider network.

According to a first broad aspect of an embodiment, there is provided a modulator sub-system for generating a corrected divisor signal for use by a divider network in a fractional-N phase locked loop circuit. The modulator sub-system includes a modulator, a correction circuit and an adder. The modulator is arranged to receive an input signal that includes a first plurality of bits and a second plurality of bits and generate, based on the input signal, a divisor signal. The correction circuit includes a condition detecting circuit and a filter. The condition detecting circuit is arranged to: receive a subset of the first plurality of bits; detect, based on the subset of the first plurality of bits, a condition wherein the divisor signal is likely to be incorrect; and generate a condition detection output indicating the condition. The filter is arranged to generate a correction signal based on the condition detection output. The adder is arranged to form the corrected divisor signal as a sum of the divisor signal and the correction signal.

According to a second broad aspect of an embodiment, there is provided a method for correcting an output of a modulator, where the modulator accepts, as input, a plurality of binary modulation values. The method includes monitoring at least a portion of the plurality of binary modulation values, recognizing, responsive to the monitoring, a condition wherein output of the modulator is likely to be incorrect due to differing propagation rates of the plurality of binary modulation values through the modulator, generating, responsive to the recognizing, a correction factor and adding the correction factor to the output of the modulator.

According to a third broad aspect of an embodiment, there is provided a fractional-N phase locked loop. The fractional-N phase locked loop includes a voltage controlled oscillator for generating a phase locked loop output signal with a frequency based on a received bias signal, a divider circuit adapted to generate a reference signal based on a source signal received from a frequency source, a divider network for generating a feedback signal having a frequency that is a quotient obtained by dividing the frequency of the phase locked loop output signal by an integer divisor, a phase frequency detector for generating phase control signals based on a difference between the feedback signal and the reference signal and a modulator sub-system for providing the integer divisor to the divider network. The modulator sub-system includes a modulator arranged to receive an input signal that includes a first plurality of bits and a second plurality of bits and generate, based on the input signal, a divisor signal, a correction circuit including a condition detecting circuit and a filter, the condition detecting circuit arranged to receive a subset of the first plurality of bits, detect, based on the subset of the first plurality of bits, a condition wherein the divisor signal is likely to be incorrect and generate a condition detection output indicating the condition, the filter arranged to generate a correction signal based on the condition detection output and an adder arranged to form the integer divisor, for use in the divider network, as a sum of the divisor signal and the correction signal.

According to a fourth broad aspect of an embodiment, there is provided a mobile device. The mobile device includes an antenna, a crystal oscillator and a transceiver communicatively connected to the antenna for transmitting and receiving. The transceiver includes a fractional-N phase locked loop, which includes a voltage controlled oscillator for generating a phase locked loop output signal with a frequency based on a received bias signal, a divider circuit adapted to generate a reference signal based on a source signal received from the crystal oscillator, a divider network for generating a feedback signal having a frequency that is a quotient obtained by dividing the frequency of the phase locked loop output signal by an integer divisor, a phase frequency detector for generating phase control signals based on a difference between the feedback signal and the reference signal and a modulator sub-system for providing the integer divisor to the divider network. The modulator sub-system includes a modulator arranged to receive an input signal that includes a first plurality of bits and a second plurality of bits and generate, based on the input signal, a divisor signal, a correction circuit including a condition detecting circuit and a filter, the condition detecting circuit arranged to receive a subset of the first plurality of bits, detect, based on the subset of the first plurality of bits, a condition wherein the divisor signal is likely to be incorrect and generate a condition detection output indicating the condition, the filter arranged to generate a correction signal based on the condition detection output and an adder arranged to form the integer divisor, for use in the divider network, as a sum of the divisor signal and the correction signal.

BRIEF DESCRIPTION OF THE DRAWINGS

The embodiments will now be described by reference to the following figures, in which identical reference numerals in different figures indicate identical elements and in which:

FIG. 7 is a truth table for the integer boundary crossing detector shown in FIG. 6;

DETAILED DESCRIPTION

Figure 1:
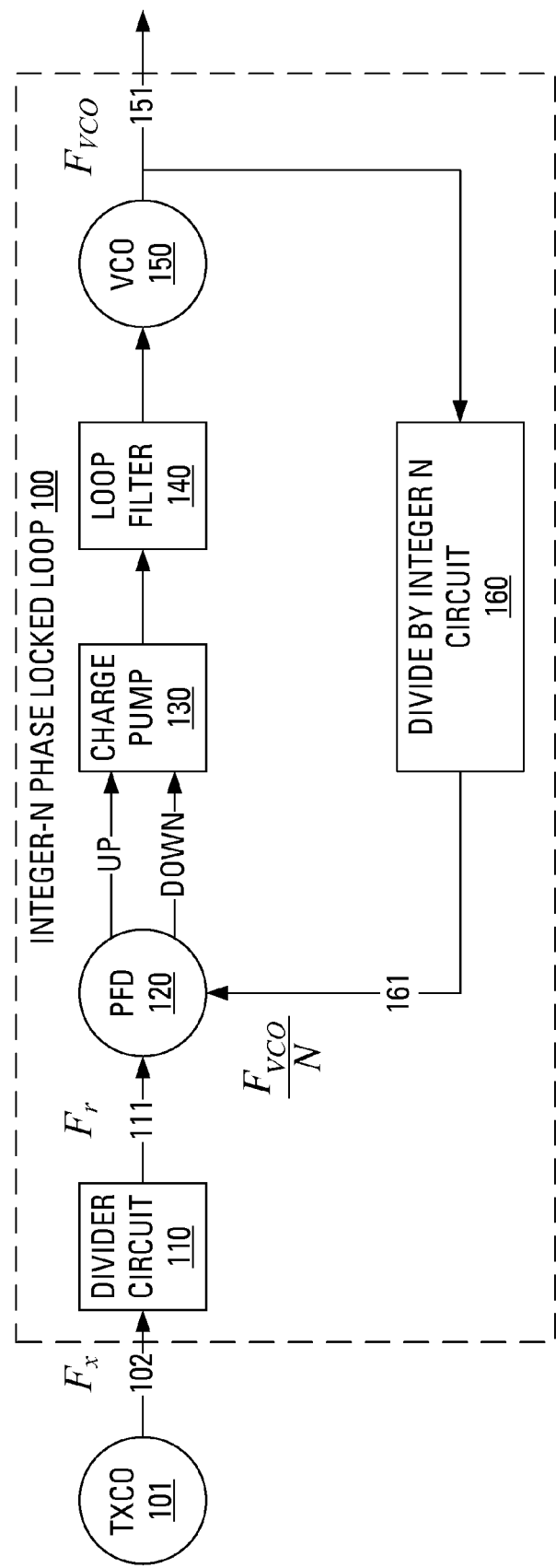
FIG. 1 is a prior art simplified block diagram of a conventional integer-N phase locked loop (PLL) circuit having a divide by integer N circuit.

A conventional integer-N PLL 100 is shown in prior art FIG. 1. The conventional integer-N PLL 100 employs a phase frequency detector (PFD) 120 having, as inputs, a reference signal 111 (with a "reference" frequency $F_r$) and a feedback signal 161. The PFD 120 has, as outputs, phase control signals (UP/DOWN). The conventional integer-N PLL 100 also employs a VCO 150 and a divide by integer N circuit 160 (a divider network) that operates, on a signal 151 output from the VCO 150 with "output" frequency $F_{VCO}$, to generate the feedback signal 161. Typically, a charge pump 130 and a loop filter 140 are interposed between the output of the PFD 120 and the input of the VCO 150.

In operation, the phase control signals (UP/DOWN) generated by the PFD 120 depend upon the phase and frequency differences between the reference signal 111 and the feedback signal 161. The phase control signals (UP/DOWN) generated by the PFD 120 are provided to the charge pump 130 and the resultant output of the charge pump 130 is filtered by the loop filter 140 to provide a variable bias voltage for the VCO 150.

Thus, the output frequency $F_{VCO}$ may be defined in terms of the value N and the reference frequency $F_r$:

$$F_{VCO} = N \cdot F_r. \tag{0.1}$$

Typically, the reference signal 111 is obtained by dividing down, on-board the PLL IC (by an integer value R) at a divider circuit 110, a signal 102 (having a "crystal" frequency $F_x$) provided by an external crystal oscillator 101. The feedback signal 161 has a feedback frequency of $$\frac{F_{VCO}}{N}.$$

When the conventional integer-N PLL 100 is in a locked state, the two inputs to the PFD 120 are equal:

$$\frac{F_{VCO}}{N} = \frac{F_x}{R} = F_r. \tag{0.2}$$

On the other hand, when the conventional integer-N PLL 100 is in an unlocked state, such as, for example, during initial power up or immediately after programming a new value for N, the PFD 120 creates an error voltage signal that corresponds to the phase difference between the reference frequency, $F_r$, and the feedback frequency, $$\frac{F_{VCO}}{N}.$$

When the error voltage signal, after processing by the charge pump 130 and the loop filter 140, is fed into the VCO 150, the output frequency $F_{VCO}$ will vary until equilibrium is reached such that the feedback frequency equals the reference frequency $F_r$ and the error voltage signal is negligible.

In digital PLL synthesis, it will be understood that frequency multiplication by N raises the output signal's phase noise by 20 log(N) dB simply as the ratio, N, of the two periods while the time jitter stays the same.

Because the PFD 120 is typically a dominant source of close-in phase noise, the value of N becomes a limiting factor in PLL design because of the resulting phase noise performance of the output signal.

For example, if N was 30,000, which is a typical value used by an integer-N PLL synthesizer for a cellular transceiver having 30 kHz spacing, about 90 dB would be added to the reference noise floor.

Thus, it would be beneficial to reduce the value of N as much as possible for noise immunity purposes.

The loop filter 130 is typically narrow in bandwidth and is used to filter out spurious signals created by the PFD 120. The PFD 120 generates high levels of transient noise at its frequency of operation $F_r$. Without the loop filter 140, such noise would be superimposed on the bias voltage to the VCO 150 and thus correspondingly modulate the output frequency $F_{VCO}$ to create spurious interference signals at offsets of $\pm F_r$ (and its harmonics) around $F_{VCO}$.

The time required for the conventional integer-N PLL 100 to switch between frequencies (channels) increases as the loop filter 140 bandwidth decreases. For a 2$^{nd}$ order loop with a natural frequency or loop bandwidth of ωn and a damping factor ζ, the switching speed $T_{sw}$ of the PLL is proportional to the inverse of their product:

$$T_{SW} \propto \frac{1}{\omega n \zeta}. \tag{0.3}$$

Thus, with a sufficiently small value of N, the reference frequency $F_r$ could be made sufficiently large that the loop filter bandwidth ωn would not significantly adversely affect the switching speed $T_{sw}$ of the PLL.

While, theoretically, the output frequency, $F_{VCO}$, of the signal 151 at the output of the VCO 150 may be tuned to a desired frequency, simply by varying the value of N, a limiting factor is that the minimum frequency resolution or minimal channel spacing of a system employing the PLL is also equal to the reference frequency $F_r$:

$$F_r = \text{channel spacing} = \frac{F_{VCO}}{N}. \tag{0.4}$$

This dependence of the channel spacing on the frequency, $F_{VCO}$, of the signal 151 output by the VCO 150 and the value of N typically constrains phase detectors to operate at, or near to, the channel spacing of the communication system to provide satisfactory capacity.

So-called fractional-N PLL technology allows for a frequency resolution that is a fractional portion of the reference frequency $F_r$ so that the reference frequency $F_r$ may be higher than the channel spacing and overall division by N may be reduced.

While a primary motivation for using fractional-N PLL architecture is to improve phase noise by allowing for a greater reference frequency $F_r$ for a given channel spacing, increasing the reference frequency $F_r$ relative to the division integer N may also have the ancillary effect of improving switching speed by increasing loop bandwidth, as described above, and improving, in some applications, other performance results over integer-N PLL technology.

In general terms, fractional-N PLL technology allows frequency resolution that is a fractional proportion of the reference frequency. That is to say, it permits the relationship between N, $F_r$ and the channel spacing of the frequency synthesizer to be adjusted to achieve frequency resolution that is a fractional portion of the phase detector operational frequency.

In fractional-N PLL circuits, internal circuitry enables the value of the divisor to be dynamically changed while in the locked state. By switching the value of the divisor used by the divide by integer N circuit 160 between N and (N+1) in a certain proportion, an average non-integer value division ratio may be realized that is equal to N plus an arbitrary fraction K/F, where K is an integer value representing a fractional channel of operation and F is an integer value representing a fractional resolution or modulus of the circuit.

The channel spacing may then be determined from $$\text{channel spacing} = \frac{F_r}{F}. \tag{0.5}$$

In such circuits, the VCO 150 may operate at a frequency that is higher than the synthesizer channel spacing:

$$F_{VCO} = F_r\left(N + \frac{K}{F}\right). \tag{0.6}$$

Considering, for example, a cellular system employing 30 kHz channel spacing, choosing a fractional resolution F of 16 allows the reference frequency $F_r$ to be 480 kHz (see Equation (0.5)).

For a fixed $F_{VCO}$, a 16-fold increase in the reference frequency is offset by a reduction of N by a factor of 16 (see Equation (0.6)). Beneficially, the reduction of N by a factor of 16 gives rise to a theoretical reduction of 20 log(16)=24 dB in phase noise performance.

For an example 900 MHz design, reduction, by a factor of 16, of the total design ratio N that is originally 30,000 (as N is for integer-N PLL architecture) leads to an N of approximately 1800 for a fractional-N PLL architecture.

As there is, to date, no circuit device that is able to perform division by a fraction, a fractional-N PLL architecture may change the divisor in the feedback loop dynamically between values of N and (N+1). The average effect of so doing is to divide by a fractional value of between N and (N+1). By varying the number of cycles that the divisor takes on each value, any fraction may be generated. For example, to obtain a fraction of $$N + \frac{K}{F},$$

a total of F cycles are employed, in which, for K cycles, a divisor value of (N+1) is employed and for (F−K) cycles, a divisor value of N is employed. As will be discussed hereinafter, dependent upon the desired average value of the fractional portion of the divisor, alternative divisor values may be used.

Figure 2:
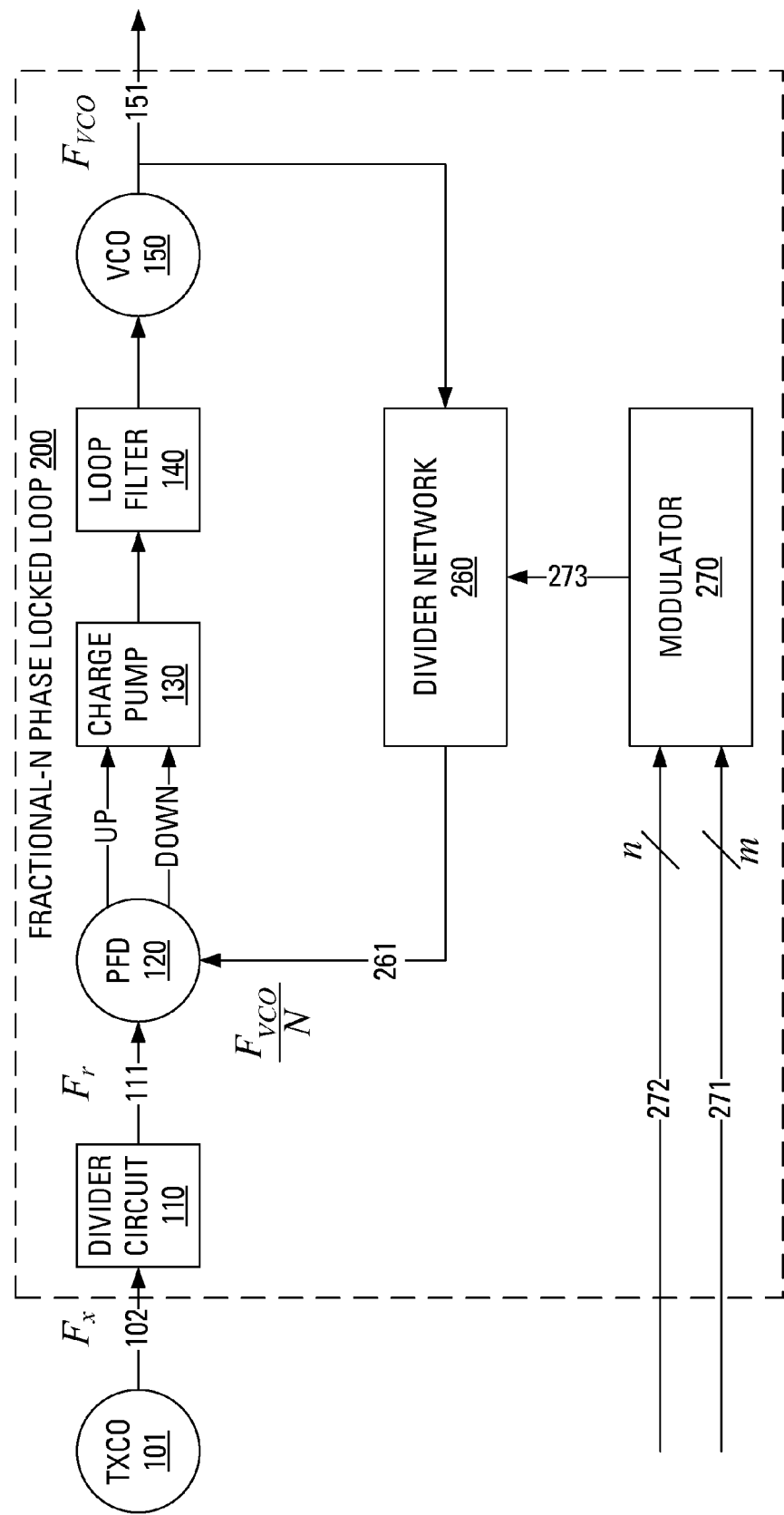
FIG. 2 is a prior art simplified block diagram of a conventional fractional-N PLL, wherein a modulator provides a divisor signal to the divide by integer N circuit.

As may be seen in FIG. 2, a prior art implementation of a fractional-N PLL structure 200 has a number of components in common with the conventional integer-N PLL 100 shown in FIG. 1, namely the divider circuit 110, the PFD 120, the charge pump 130, the loop filter 140 and the VCO 150. However, the "divide by integer N" circuit 160 is replaced by a more general divider network 260 and a corresponding first order modulator 270.

The divider network 260 corresponds roughly to the "divide by integer N" circuit 160 in that it accepts a feedback signal corresponding to the desired output frequency $F_{VCO}$ as an input and provides a divided out signal 261 to the PFD 120. However, rather than having a fixed integer value, N, by which the division is performed, as performed by the "divide by integer N" circuit 160 in FIG. 1, the divider network 260 is more generic and relies upon the receipt of an integer value for use as a divisor on an ongoing basis. The integer value for use as a divisor is provided by the modulator 270 as a divisor signal 273. The integer value for use as a divisor may be, for example, of length (m+n) and in binary 2's complement format.

Indeed, as the fractional-N PLL concept relies on use of distinct integer divisor values (e.g., N and N+1), the divider network 260 may be adapted to accept a variety of divisor values.

For this reason, fractional-N PLLs may be more commonly found in implementations incorporating swept frequencies or modulation for many purposes, such as for polar modulation (for example, for phase shift keying), for radio frequency signaling, or for spread spectrum communications to reduce peak electronic emissions. As will be appreciated by those having ordinary skill in this art, spread spectrum implementations spread the spectrum so that the peak power in one or more frequency bins may be reduced. In some example embodiments, the carrier power may be spread over a few percent (2%, for example), and the peak power in any band of 100 kHz, for example, may be reduced by as much as 10 dB. With fractional-N PLLs, it is optionally possible for a single external crystal reference to be employed to generate all of the operational frequencies.

The integer values provided to the divider network 260 for use as a divisor are supplied by the modulator 270, which, in some instances, may include an accumulator. In practice, divisor values of (N−2), (N−1), N, (N+1), (N+2) and (N+3) are usually allowed as input to the divider network 260. In practice, (N−1), N, (N+1) and (N+2) are most likely to appear at the output of the modulator 270. When the desired fractional portion of the divisor is close to zero, (N−1), N and (N+1) are likely to appear almost uniformly. When the desired fractional portion of the divisor is close to 1, N, (N+1) and (N+2) are likely to appear almost uniformly. When the desired fractional portion of the divisor is close to 0.5, N and (N+1) are likely to appear evenly, with (N−1) and (N+2) appearing occasionally. The higher order the modulator (a $2^{nd}$ order example is presented here, but $3^{rd}$ order modulator is quite common), the more likely outlying values, such as (N−2) and (N+3), are to appear.

The illustrated modulator 270 receives a binary 2's complement number of length (m+n) comprising an integer portion 271 of length m and a fractional portion 272 of length n. This binary 2's complement number corresponds to the desired fractional divisor value $$N + \frac{K}{F},$$

with the integer portion thereof being of value N. As discussed previously, in effect, the modulator 270 provides fractional multiplication capability by dithering the integer value presented to the divider network 260 to represent both the integer portion and the fractional portion (plus a high frequency noise component). As discussed, the divisor values supplied to the divider network 260 may vary among integer values (e.g., N and N+1) in a proportion equivalent to the fractional component $$\frac{K}{F},$$

which will have an arbitrary fractional precision based upon the precision of the modulator 270 itself.

Figure 3:
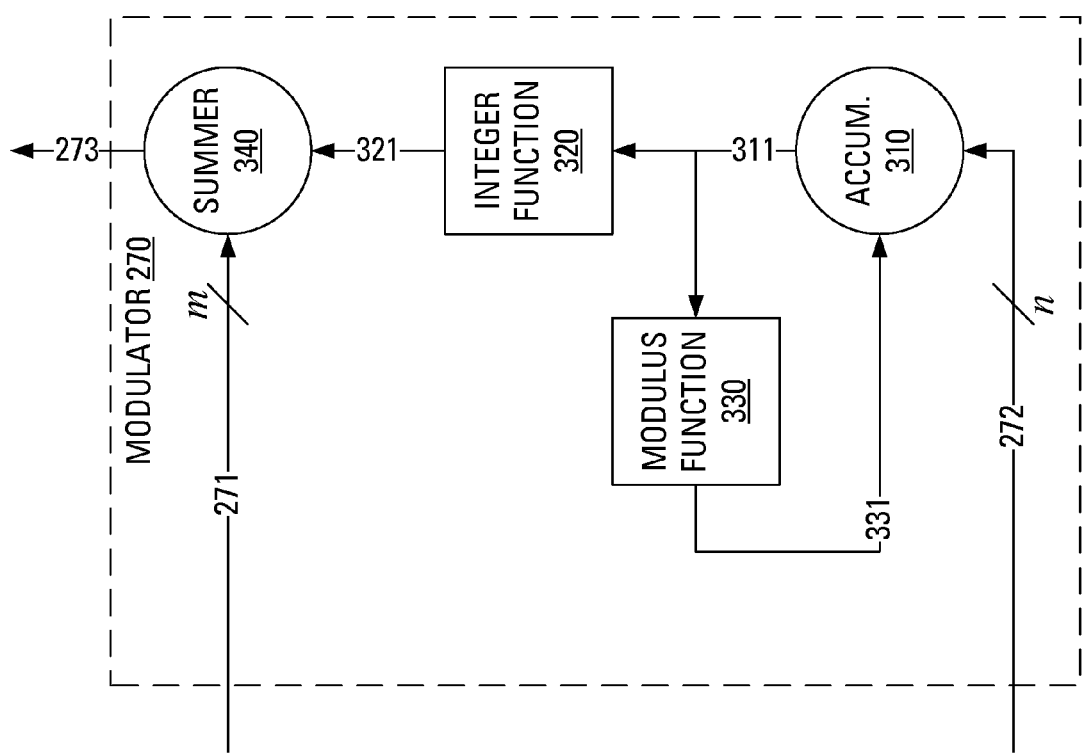
FIG. 3 is a prior art simplified block diagram of a delta-sigma modulator (DSM) implementation of the modulator shown in FIG. 2.

In at least some digital embodiments, the modulator 270 is implemented using an accumulator, such as is shown in prior art FIG. 3. In such an embodiment, known as a delta-sigma (Δ-Σ) modulator or DSM, the modulator 270 comprises an accumulator 310, an integer module 320, a modulus module 330 and a summer 340. The fractional portion 272 of the binary 2's complement number presented to the modulator 270 is fed into a first input of the accumulator 310. The second input thereof is connected to the output of the modulus module 330. The modulus module 330 passes through only the fractional portion of an input binary value. The output 311 of the accumulator, which is the additive sum of the two input values, is fed into the input of the modulus module 330 as well as the input of the integer function 320. The output 321 of the integer function 320 is fed into an input of the summer 340. The summer 340 accepts the integer portion 271 of the binary 2's complement number presented to the modulator 270 and additively sums the integer portion 271 with the output 321 of the integer function 320. The resulting divisor signal 273 is fed to the divider network 260.

Those having ordinary skill in this art will appreciate that such an embodiment will generate a divisor of value N for presentation to the divider network 260 until such time as the consecutive summation of the fractional portion is sufficient to cause the output 311 of the accumulator 310 to exceed 1, that is, to cause an overflow condition. At this point, the divisor signal 273 output from the summer 340 will be N+1.

As indicated previously, the integer portion 271 of the binary 2's complement number will be N, while the fractional portion 272 of the binary 2's complement number will be chosen so that overflow conditions will occur K times every F cycles.

It will be appreciated that in some applications, the desired divisor value may change due to the shape of the carrier waveform or because of modulation. For example, the desired divisor value may vary in a sinusoidal manner over time, increasing and decreasing between upper and lower values of the modulation range.

While DSM embodiments have the advantage of being relatively simple to implement, use of such circuits for fractional-N synthesis and for related applications, such as multi-bit digital to analog converters using oversampling, changes to the modulation value may cause "glitches" in the desired modulation frequency, especially when the frequency modulation is small compared to the integer value of the PLL multiplication.

For example, if, in a given configuration, the PLL was trying to multiply the input frequency $F_r$ by 10 (that is, to divide the output frequency $F_{VCO}$ by 10 and modulate the output by 1%, the PLL would generate an output integer data stream to represent divisor values ranging between 10−1%=9.9 and 10+1%=10.1. In this scenario, an integer boundary is crossed during modulation.

Because the DSM circuit is an infinite impulse response (IIR) filter, with slow settling in the step response, the propagation times of different values, such as the fractional and integer portions of the binary 2's complement number presented to the modulator 270, throughout the circuit may vary somewhat. Phrased another way, propagation delay within the modulator 270 may result in a change in the fractional portion 272 being recognized at a different time than the time at which a change in the integer portion 271 is recognized.

Thus, for example, when the desired divisor value changes from just under 10 to 10, the fractional portion 272 of the binary 2's complement number presented to the modulator 270 changes from a large value to a small, even zero, value. Since an IIR filter such as the modulator 270 is characterized by a memory, the filter response of the modulator 270 may take many cycles for the large value of the fractional portion 272 of the binary 2's complement number to be flushed completely. At the same time, the integer portion 271 of the binary 2's complement number presented to the modulator 270 changes from a small value to a larger value.

Accordingly, there is a "glitch" caused by the delay in propagating the change in the fractional portion 272 through the modulator 270. In the example circuit illustrated in FIG. 3, the glitch manifests itself in the old fractional portion 272 being combined with the new integer portion 271.

Thus, in the scenario envisaged above, rather than presenting a transition of the divisor from 9.9 to 10.1, a difference of 0.2, the glitch may cause a temporary transition of the divisor from 9.9 to 10.9. Immediately after the temporary transition, the divisor signal 273 is likely to be incorrect. A few cycles after the transition, the divisor may effectively be back down to 10.1. The incorrect divisor signal 273 may cause the fractional-N PLL structure 200 shown in FIG. 2 to lose lock and may, almost certainly, cause modulation errors.

By the same token, when the desired divisor value is sought to be changed from 10.1 to 9.9. Immediately after the temporary transition, the divisor signal 273 is likely to be incorrect. A few cycles after the transition, the divisor may effectively be back up to 9.9.

It may be seen that, depending upon the values chosen, the glitch could conceivably easily be larger than the desired modulation frequency.

A correction circuit will now be described, for the purposes of illustration only, in conjunction with certain embodiments shown in the enclosed drawings. While embodiments are disclosed, this is not intended to be limiting. Rather, the general principles set forth herein are considered to be merely illustrative of the scope of the present application and it is to be further understood that numerous changes covering alternatives, modifications and equivalents may be made without straying from the scope of the present application.

In particular, all aspects described herein are intended solely to provide examples for the purposes of illustrating certain embodiments and are not intended to limit the scope of the invention to any embodiments that may depart from such dimensions as may be specified.

Figure 4:
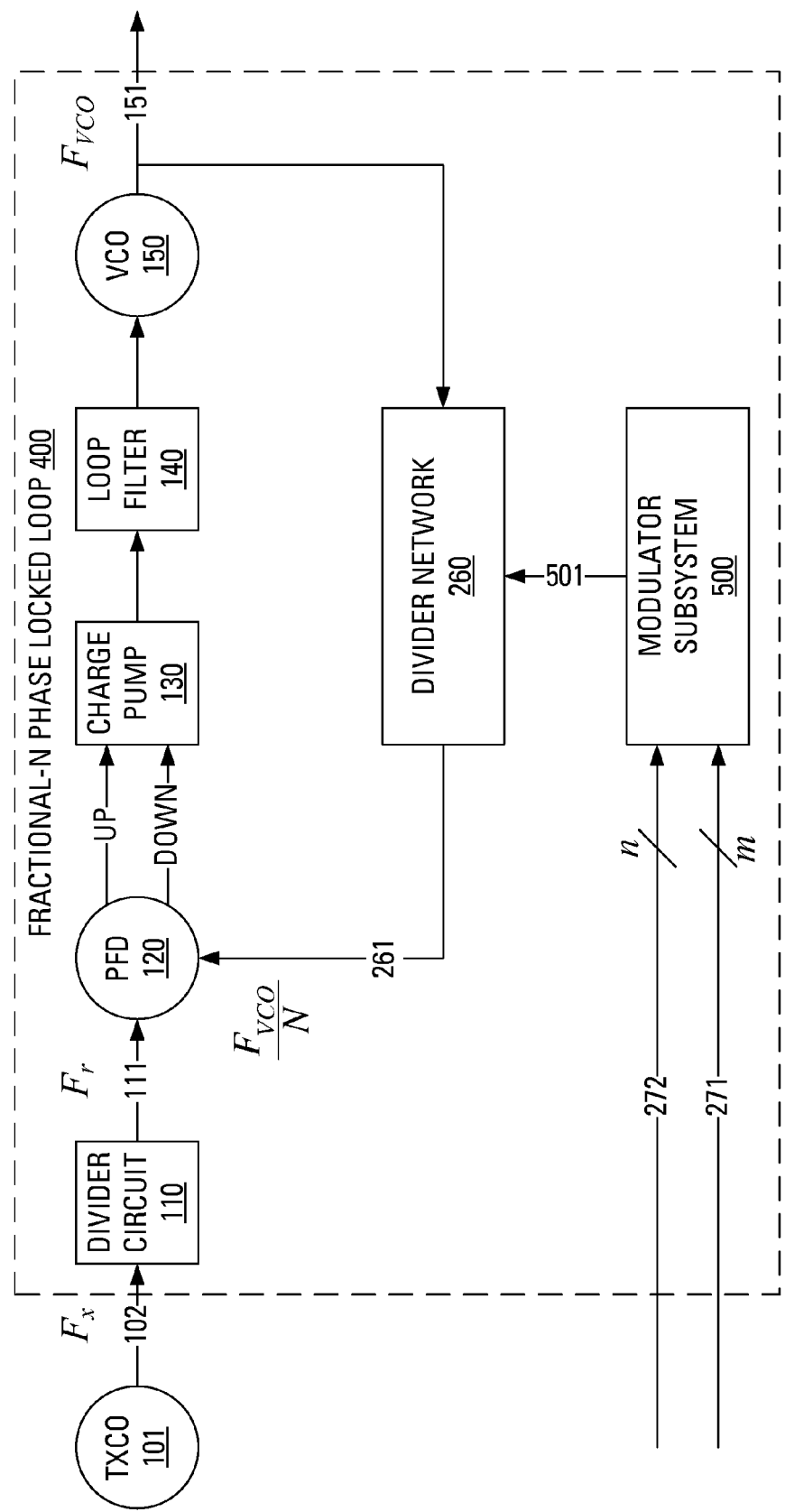
FIG. 4 is a simplified block diagram of a fractional-N PLL according to an example embodiment wherein a modulator sub-system provides a divisor signal to the divide by integer N circuit.

In overview, FIG. 4 illustrates a fractional-N PLL 400 wherein, according to an example embodiment, a modulator sub-system 500 has been substituted for the modulator 270 in the fractional-N PLL circuit shown in FIG. 2.

The illustrated modulator sub-system 500 receives the same binary 2's complement number, comprising the integer portion 271 of length m and the fractional portion 272 of length n, that the modulator 270 is illustrated as receiving in FIG. 2. Responsively, the illustrated modulator sub-system 500 generates a corrected divisor signal 501 which feeds into the divider network 260.

Figure 5:
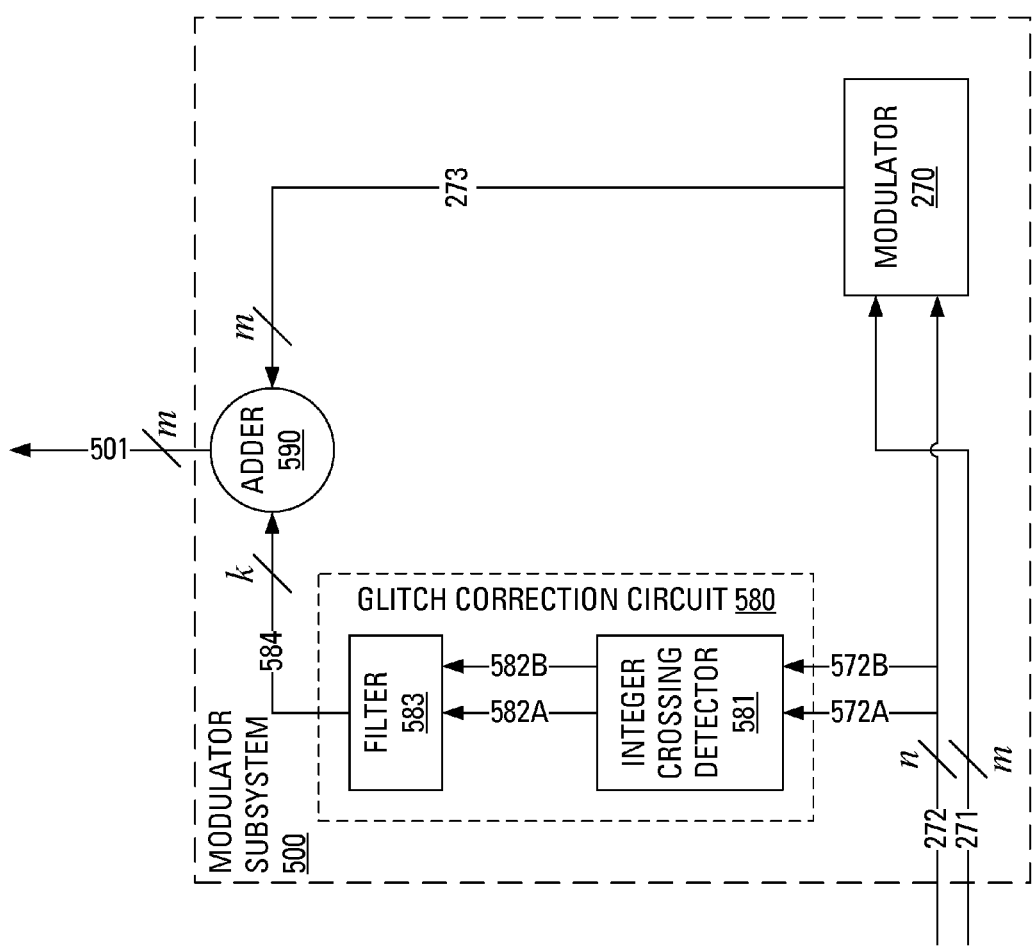
FIG. 5 is a simplified block diagram of an implementation of the modulator sub-system shown in FIG. 4 according to an example embodiment, where the modulator sub-system includes a 2nd order DSM and a correction circuit with an integer boundary crossing detector.

Now referring to FIG. 5, there is shown, an example circuit schematic representation of an improved modulator sub-system shown generally at 500 in dashed outline. The modulator sub-system 500 comprises the modulator 270, a glitch correction circuit 580 and an adder 590. The glitch correction circuit 580 includes an integer boundary crossing detector 581 and a filter 583.

In operation, the modulator 270 accepts, as input, the m-bit integer portion 271 and the n-bit fractional portion 272 of the binary 2's complement number presented to the modulator sub-system 500 and generates the divisor signal 273. The modulator 270 provides a fractional multiplication capability by dithering the divisor signal 273 presented to the adder 590 to represent both the integer portion and the fractional portion. The values of the divisor signal 273 supplied to the adder 590 may vary between two integer values (e.g., N and N+1) in a proportion equivalent to the fractional component $$\frac{K}{F}.$$

The integer boundary crossing detector 581 accepts, as input, a signal that comprises a subset of the bits representing the fractional portion 272 of the binary 2's complement number presented to the modulator sub-system 500. In the example embodiment shown in FIG. 5, the two most significant bits (572A, 572B) of the fractional portion 272 constitute the input signal provided to the integer boundary crossing detector 581. Using the most significant bits 572A, 572B ensures, for a 2's complement binary representation, that a boundary change may be recognized. More than one bit is provided in order to allow simplification of the circuit design to differentiate between an integer boundary change and otherwise. For example, a large change in the bits (for example, from '11' to '00' or from '00' to '11') would signal an integer boundary change, while a small change (for example, from '10' to '01' or from '01' to '10') indicative of no boundary change, could be recognized without recourse to further processing. Conceivably, all of the bits could be provided, but as shown in the example embodiment, satisfactory information may be gleaned from utilizing only a subset of the bits available.

The integer boundary crossing detector 581 generates an output signal that feeds into the filter 583. The signal output by the integer boundary crossing detector 581 may be one or more single bit signals. As shown in FIG. 5, the integer boundary crossing detector 581 outputs condition detection output signals 582A, 582B.

The filter 583 may react to the activation of at least one of the bit signals by outputting a positive correction factor (having a magnitude of 2, in this case). Similarly, the filter 583 may react to the activation of at least one other bit signal by outputting a negative correction factor (having a magnitude of 2, in this case). The filter 583 may react to the absence of bit signal activation by outputting a zero correction factor.

Alternatively, the filter 583 may output a specific 2's complement binary integer to signal a positive correction factor, may output a further 2's complement binary integer to signal a negative correction factor and may output an additional 2's complement binary integer to signal a zero correction factor.

Figure 6:
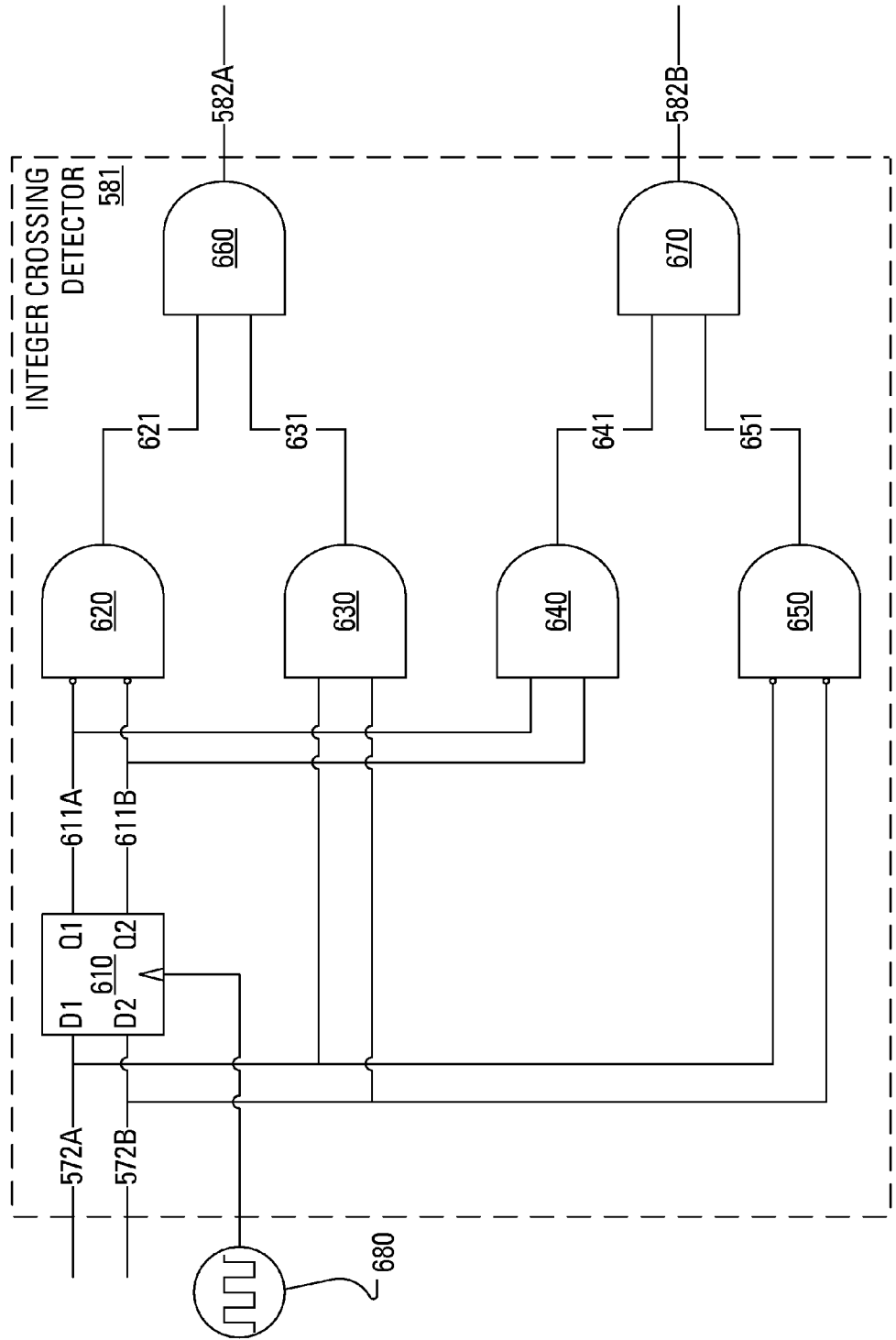
FIG. 6 is a simplified block diagram of an example embodiment of integer boundary crossing detector shown in FIG. 5.

An example integer boundary crossing detector circuit diagram is shown in FIG. 6. The integer boundary crossing detector 581 comprises, in the illustrated embodiment, a latch 610, a first stage of AND gates and a second stage of AND gates. The first stage of AND gates includes a first inverted-input AND gate 620, a first regular-input AND gate 630, a second regular-input AND gate 640 and a second inverted-input AND gate 650. The second stage of AND gates includes a third regular-input AND gate 660 and a fourth regular-input AND gate 670.

The latch 610 may be a D flip flop configured to receive a clock input from a clock circuit 680 and to add a single clock cycle delay as between its input signal, which is the most significant bits 572A, 572B of the fractional portion 272 of the binary 2's complement number presented to the modulation sub-system 500, and its output signal 611A, 611B.

Those having ordinary skill in this art will appreciate that an integer boundary crossing will thus be considered to have occurred when the bits (572A, 572B) of the input signal both change from a '1' to a '0' or vice versa, that is, from '11' to '00' or from '00' to '11'.

Each of the bits (611A, 611B) of the delayed output of the latch 610 are presented to corresponding inputs of the first inverted-input AND gate 620 and the second regular-input AND gate 640, while each of the non-delayed input bits (572A, 572B) of the input signal are presented to corresponding inputs of the first regular-input AND gate 630 and of the second inverted-input AND gate 650.

Thus, if the bits in the bit pattern presented to one of the first inverted-input AND gate 620 are '00', gate output 621 of the first inverted-input AND gate 620 will be '1'. Otherwise the gate output 621 will be '0'.

Similarly, if the bits in the bit pattern presented to one of the second inverted-input AND gate 650 are '00', gate output 651 of the second inverted-input AND gate 650 will be '1'. Otherwise the gate output 651 will be '0'.

By the same token, if the bits in the bit pattern presented to the first regular-input AND gate 630 are '11', gate output 631 of the first regular-input AND gate 630 will be '1'. Otherwise the gate output 631 will be '0'.

Additionally, if the bits in the bit pattern presented to the second regular-input AND gate 640 are '11', gate output 641 of the second regular-input AND gate 640 will be '1'. Otherwise the gate output 641 will be '0'.

The output 621 of the first inverted-input AND gate 620 (fed by delayed signals 611A and 611B) and the output 631 of the first regular-input AND gate 630 (fed by non-delayed signals 572A and 572B) are fed, as inputs, to the third regular-input AND gate 660. Thus, a transition from a '00' bit pattern to a '11' bit pattern will result in a condition detection output 582A of third regular-input AND gate 660 being '1', signaling a negative-going integer boundary crossing.

Similarly, the output 641 of AND gate 640 (fed by the delayed signals 611A and 611B) and the output 651 of the second inverted-input AND gate 650 (fed by non-delayed signals 572A, 572B) are fed as inputs to the fourth regular-input AND gate 670. Thus, a transition from a '11' bit pattern to a '00' bit pattern will result in the condition detection output 582B of the fourth regular-input AND gate 670 being '1', signaling a positive-going integer boundary crossing.

Thus, the condition detection output 582A, 582B of AND gates 660 and 670, respectively, may be understood to constitute control signals (active high) which may be provided to the filter 583 to apply a positive and negative integer correction factor to the second adder 590.

On the other hand, where the bit pattern remains the same both before and after imposition of a single clock cycle delay by the latch 610, or where the bit pattern changes but not from a '11' to a '00' or vice versa, neither output of the third and fourth regular-input AND gates 660 and 670 will be '1', so that no corrective factor, positive or negative, will be applied.

Table 700, shown in FIG. 7, is a truth table providing various non-delayed (572A, 572B) bit patterns and delayed (611A, 611B) bit patterns in the circuit of FIG. 6 and confirming that a positive correction is effected only when there is a negative integer boundary crossing and that a negative correction is effected only when there is a positive integer boundary crossing.

Those having ordinary skill in this art will appreciate that the size of the correction factor output by the filter 583 should be generally commensurate with the size of the inverse of the response of the modulator 270, which may or may not be a single specific integer value for all cases. In the example discussed above, an appropriate correction factor is ±2.

The filter 583 accepts, as input, the condition detection output (582A, 582B) generated by the integer boundary crossing detector 581 and generates a filtered output signal 584, which feeds into a second input of the adder 590. In one implementation, the filter 583 is a FIR filter. Those having ordinary skill in this art will appreciate that other filters, including IIR filters may be appropriate in some circumstances. However, the use of an IIR filter may introduce significant additional circuit complexity.

In one implementation, the filter 583 is designed to have an impulse response characteristic that approximately mirrors the impulse response characteristic of the modulator 270, which models an infinite impulse response. Conveniently, glitch correction may be accomplished by the filter 583 by way of compensating for a glitch from the modulator 270 by providing to the adder 590 an amount at least substantially similar to the glitch but opposite in sign.

If the filter 583 is an FIR filter, the filter 583 will not have an impulse response characteristic that exactly mirrors the infinite impulse response characteristic of the modulator 270. Nevertheless, it has been observed that an FIR filter may provide a sufficiently approximating response for the purposes of glitch correction.

The adder 590 accepts, as inputs, the divisor signal 571 generated by the modulator 270 and the filtered output signal 584 generated by the filter 583. The adder 590 generates the corrected divisor signal 501 which feeds into the divider network 260.

Figure 8:
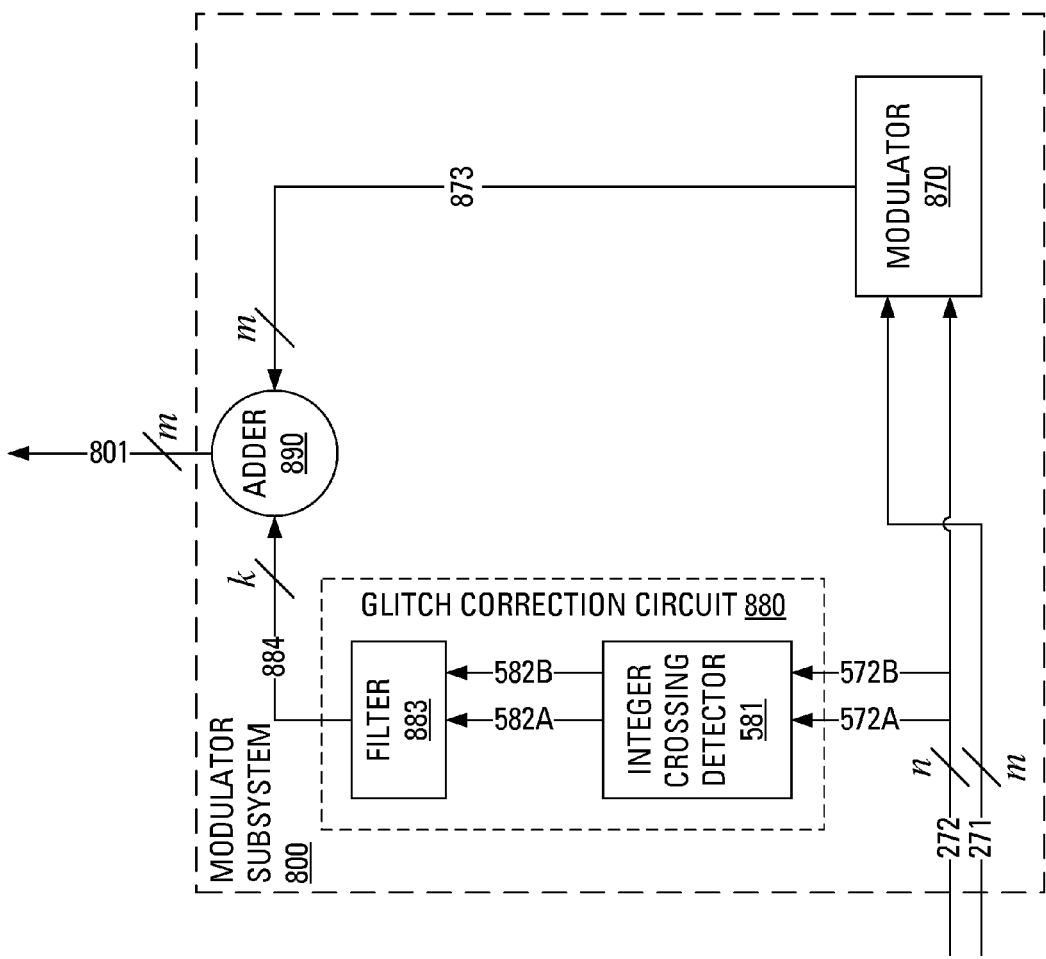
FIG. 8 is a simplified block diagram of an implementation of a modulator sub-system for use in the fractional-N PLL shown in FIG. 4 according to another example embodiment, where the modulator sub-system includes a 2nd order DSM and a correction circuit.

Now referring to FIG. 8, there is shown, an example circuit schematic representation of an improved modulator sub-system shown generally at 800 in dashed outline. The modulator sub-system 800 of FIG. 8 differs from the modulator sub-system 500 of FIG. 5 in the replacement of the modulator 270, which has been described in detail in conjunction with FIG. 3, with a modulator 870, which will be described in detail in conjunction with FIGS. 9A, 9B and 9C. In common with the modulator sub-system 500 of FIG. 5, the modulator sub-system 800 of FIG. 8 includes a glitch correction circuit 880 and an adder 890, where the glitch correction circuit 880 includes the integer boundary crossing detector 581 and a filter 883.

In operation, the modulator 870 accepts, as input, the m-bit integer portion 271 and the n-bit fractional portion 272 of the binary 2's complement number presented to the modulator sub-system 800 and generates a divisor signal 873. The modulator 870 provides a fractional multiplication capability by dithering the divisor signal 873 presented to the adder 890 to represent both the integer portion and the fractional portion of the binary 2's complement number presented to the modulator sub-system 800. The values of the divisor signal 873 supplied to the adder 890 may vary between two integer values (e.g., N and N+1) in a proportion equivalent to the fractional component $$\frac{K}{F}.$$

The integer values of the divisor signal 873 supplied to the adder 890 are, in practice, allowed to range among divisor values of (N−2), (N−1), N, (N+1), (N+2) and (N+3). In practice, (N−1), N, (N+1) and (N+2) are most likely to appear at the output of the modulator 870. When the desired fractional portion of the divisor is close to zero, (N−1), N and (N+1) are likely to appear almost uniformly. When the desired fractional portion of the divisor is close to 1, N, (N+1) and (N+2) are likely to appear almost uniformly. When the desired fractional portion of the divisor is close to 0.5, N and (N+1) are likely to appear evenly, with (N−1) and (N+2) appearing occasionally. The higher order the modulator (a $2^{nd}$ order example is presented in FIG. 9A, but a $3^{rd}$ order modulator is quite common), the more likely outlying values, such as (N−2) and (N+3), are to appear.

Figure 9A:
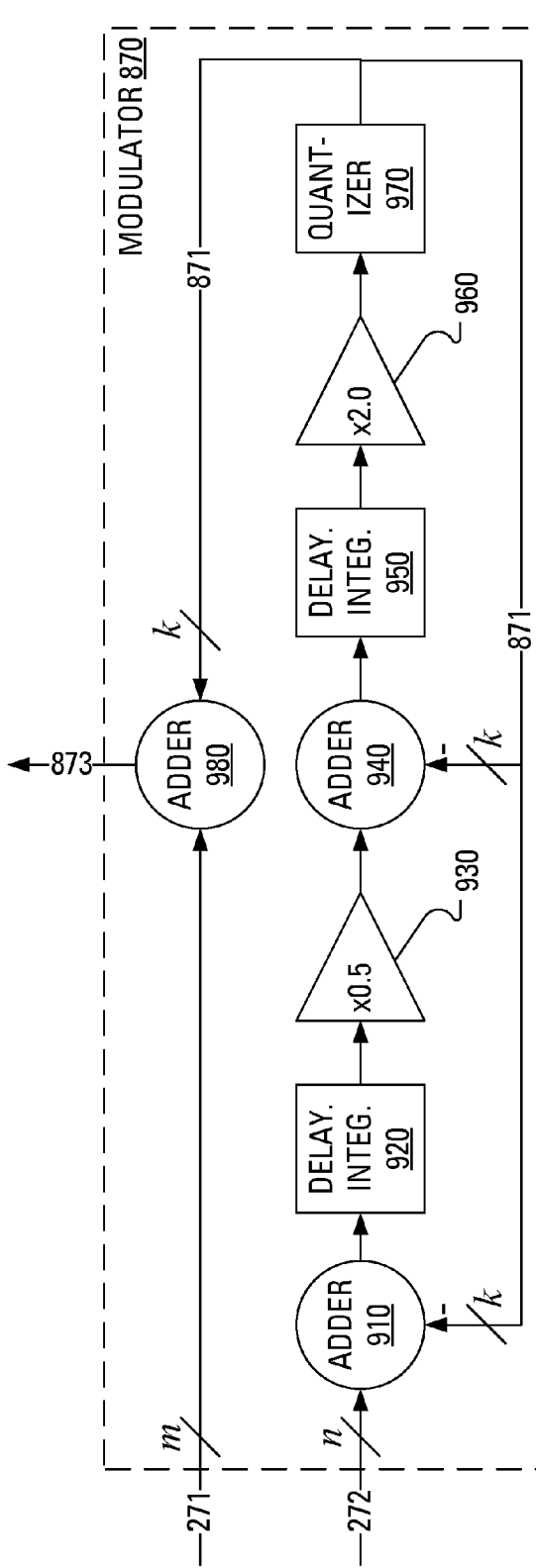
FIG. 9A is a simplified block diagram of an example embodiment of the 2nd order DSM for use in the modulator sub-system shown in FIG. 8, where the 2nd order DSM includes a first delay integrator and a second delay integrator.
Figure 9C:
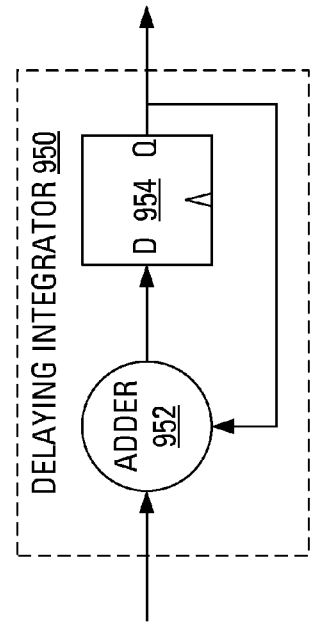
FIG. 9C is a simplified block diagram of an example embodiment of the second delay integrator for used in the 2nd order DSM shown in FIG. 9A.
Figure 9B:
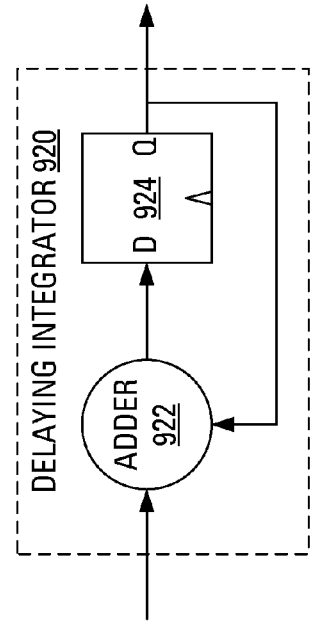
FIG. 9B is a simplified block diagram of an example embodiment of the first delay integrator used in the 2nd order DSM shown in FIG. 9A.

The modulator 870 is described in greater detail having regard to the example block diagram shown in FIG. 9A. The modulator 870, which is shown as a $2^{nd}$ order, or "dual stage", delta-sigma modulator, receives input at a first-stage adder 910. Output from the first-stage adder 910 is received at a first-stage delay integrator 920, whose output is presented to a first-stage amplifier 930. Detail of the first-stage delaying integrator 920 is shown, in FIG. 9B, to include an adder 922 and a latch 924.

Output from the first stage, i.e., output from the first-stage amplifier 930, is received by a second-stage adder 940. Output from the second-stage adder 940 is received at a second-stage delay integrator 950, whose output is presented to a second-stage amplifier 960. Detail of the second-stage delaying integrator 950 is shown, in FIG. 9C, to include an adder 952 and a latch 954. Output from the second stage, i.e., output from the second-stage amplifier 930, is presented to a quantizer 970. The output of the quantizer 970 is a k-bit 2's complement integer output stream 971 that feeds into an input of a third adder 980. The value k may be any suitable integer value greater than one. In an example embodiment, k is 3. Thus, the quantizer 970 may generate a stream of integers ranging from −4 to 3 and in suitably proportionate frequency such that the average output value will be roughly equal to the fractional portion 272 of the binary 2's complement number presented to the modulator sub-system 500.

The third adder 980 accepts, as one input, the k-bit 2's complement integer output stream 971 generated by the quantizer 970 and, as the other input, the m-bit integer portion 271 of the binary 2's complement number presented to the modulator sub-system 800. The third adder 980 generates the divisor signal 873 (an m-bit 2's complement signal) that feeds into the adder 590 (see FIG. 5) as the sum of the quantizer output 971 and the integer portion 271. The quantizer output 971 is also fed back to the first-stage adder 910 and the second-stage adder 940.

In operation, the first-stage adder 910 receives the fractional portion 272 of the binary 2's complement number presented to the modulator sub-system 500. The output 971 generated by the quantizer 970 is fed back and is subtracted from the fractional portion 272 by the first-stage adder 910.

The output signal of the first-stage adder 910 is delayed and integrated by the first-stage delaying integrator 920. In particular, for each clock pulse, the latch 924 of the first-stage delaying integrator 920 outputs a sum received from the adder 922 of the first-stage delaying integrator 920 in the previous clock pulse. The adder 922 of the first-stage delaying integrator 920 then produces a new sum by adding the value of the sum output by the latch 924 to the current value of the output signal of the first-stage adder 910.

The first-stage amplifier 930 receives the sum from the latch 924 of the first-stage delaying integrator 920 and provides a gain of 0.5. That is, the value at the output of the first-stage amplifier 930 is half of the value of the input to the first-stage amplifier 930. The output of the first-stage amplifier 930 is the output of the first stage of the modulator 870.

The second-stage adder 940 receives the output of the first-stage amplifier 930. The output 971 generated by the quantizer 970 is fed back and is subtracted from the output of the first-stage amplifier 930 by the second-stage adder 940. The second-stage adder 910 generates an output signal, which may, for example, be of width n+k.

The output signal of the second-stage adder 940 is delayed and integrated by the second-stage delaying integrator 950. In particular, for each clock pulse, the latch 954 of the second-stage delaying integrator 950 outputs a sum received from the adder 952 of the second-stage delaying integrator 950 in the previous clock pulse. The adder 952 of the second-stage delaying integrator 950 then produces a new sum by adding the value of the sum output by the latch 954 to the current value of the output signal of the second-stage adder 940.

The second-stage amplifier 960 receives the sum from the latch 954 of the second-stage delaying integrator 950 and provides a gain of 2. That is, the value at the output of the second-stage amplifier 960 is double the value of the input to the second-stage amplifier 960. The output of the second-stage amplifier 960 is the output of the second stage of the modulator 870.

The output of the second-stage amplifier 960 is received, as input, by the quantizer 970.

The quantizer 970 receives the output of the second-stage amplifier 960 and generates the quantizer output signal 971. The quantizer 970 rounds off the received value to generate a binary 2's complement integer value of k bits. In an example scenario wherein k=3, the quantizer output 971 may take on values in the range [−4, −3, −2, −1, 0, 1, 2, 3].

The third adder 980 accepts, as one input, the k-bit 2's complement integer quantizer output 971 and, as the other input, the m-bit integer portion 271 of the binary 2's complement number presented to the modulator sub-system 500. The third adder 980 generates the divisor signal 873 (an m-bit 2's complement signal) that feeds into the adder 590 (see FIG. 8).

While the modulator 870 is generating the divisor signal 873, the integer boundary crossing detector 581 accepts, as input, a signal that comprises a subset of the bits representing the fractional portion 272 of the binary 2's complement number presented to the modulator sub-system 800. As discussed above, the two most significant bits (572A, 572B) of the fractional portion 272 constitute the input signal provided to the integer boundary crossing detector 581.

The integer boundary crossing detector 581 generates an output signal that feeds into the filter 883. The signal output by the integer boundary crossing detector 581 may be one or more single bit signals. As shown in FIG. 8, the integer boundary crossing detector 581 outputs condition detection output 582A, 582B.

The filter 883 may react to the activation of at least one of the bit signals by outputting a positive correction factor (having a magnitude of 2, in this case). Similarly, the filter 883 may react to the activation of at least one other bit signal by outputting a negative correction factor (having a magnitude of 2, in this case). The filter 883 may react to the absence of bit signal activation by outputting a zero correction factor.

Alternatively, the filter 883 may output a specific 2's complement binary integer to signal a positive correction factor, may output a further 2's complement binary integer to signal a negative correction factor and may output an additional 2's complement binary integer to signal a zero correction factor.

Those having ordinary skill in this art will appreciate that the size of the correction factor output by the filter 883 should be generally commensurate with the size of the inverse of the response of the modulator 870, which may or may not be a single specific integer value for all cases. In the example discussed above, an appropriate correction factor is ±2.

The filter 883 accepts, as input, the condition detection output (582A, 582B) generated by the integer boundary crossing detector 581 and generates a filtered output signal 884, which feeds into an input of the adder 890. In one implementation, the filter 883 is a FIR filter. Those having ordinary skill in this art will appreciate that other filters, including IIR filters may be appropriate in some circumstances. However, the use of an IIR filter may introduce significant additional circuit complexity.

In one implementation, the filter 883 is designed to have an impulse response characteristic that approximately mirrors the impulse response characteristic of the modulator 870, which models an infinite impulse response. Conveniently, glitch correction may be accomplished by the filter 883 by way of compensating for a glitch from the modulator 870 by providing to the adder 890 an amount at least substantially similar to the glitch but opposite in sign.

If the filter 883 is an FIR filter, the filter 883 will not have an impulse response characteristic that exactly mirrors the infinite impulse response characteristic of the modulator 870. Nevertheless, it has been observed that an FIR filter may provide a sufficiently approximating response for the purposes of glitch correction.

The adder 890 accepts, as inputs, the divisor signal 873 generated by the modulator 870 and the filtered output signal 884 generated by the filter 883. The adder 890 generates the corrected divisor signal 801, which, when the modulator sub-system 800 shown in FIG. 8 is used in place of the modulator sub-system 500 shown in FIG. 5 in the fractional-N PLL 400 shown in FIG. 4, feeds into the divider network 260.

Figure 10:
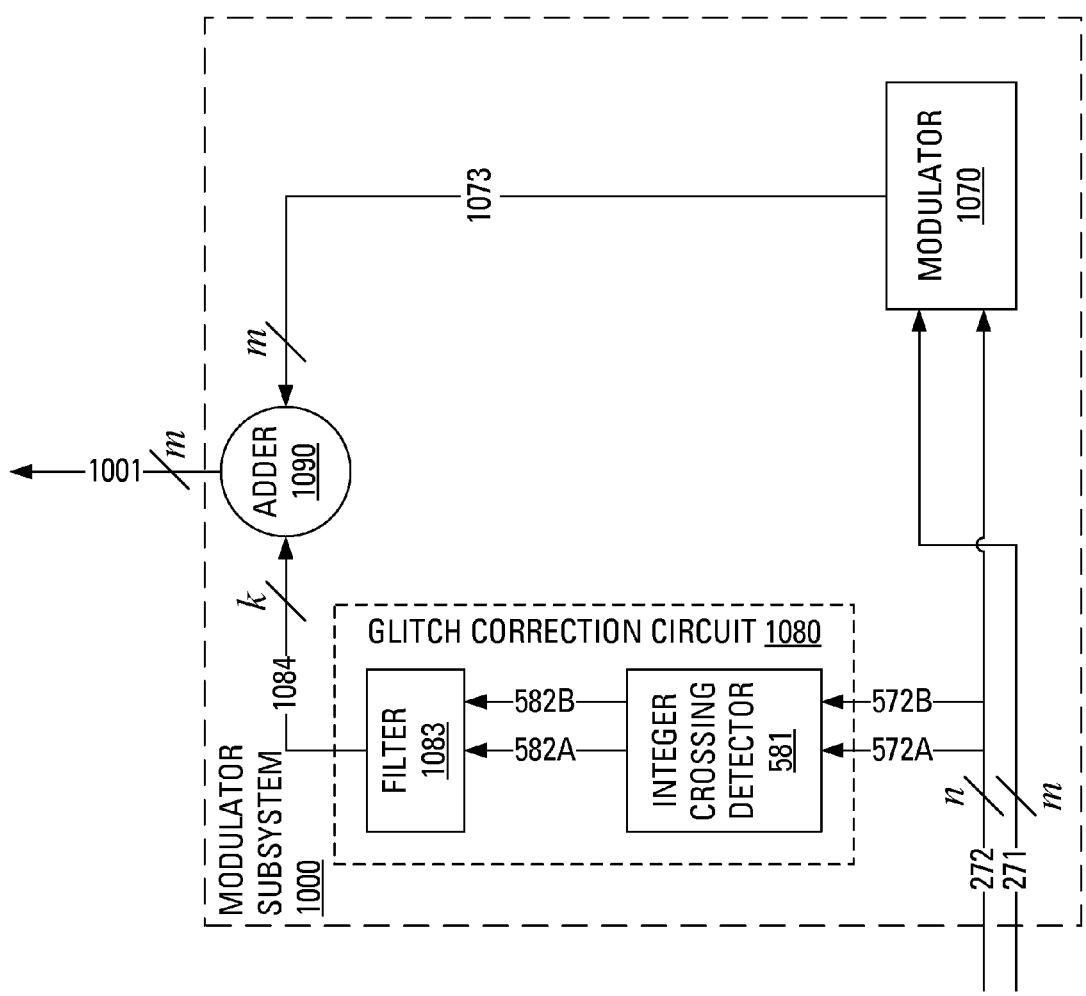
FIG. 10 is a simplified block diagram of an implementation of a modulator sub-system for use in the fractional-N PLL shown in FIG. 4 according to a further example embodiment, where the modulator sub-system includes a correction circuit with an integer boundary crossing detector and a 2nd order DSM.

Now referring to FIG. 10, there is shown, an example circuit schematic representation of an improved modulator sub-system shown generally at 1000 in dashed outline. The modulator sub-system 1000 of FIG. 10 differs from the modulator sub-system 500 of FIG. 5 in the replacement of the modulator 270, which has been described in detail in conjunction with FIG. 3, with a modulator 1070, which will be described in detail in conjunction with FIG. 11. In common with the modulator sub-system 500 of FIG. 5, the modulator sub-system 1000 of FIG. 10 includes a glitch correction circuit 1080 and an adder 1090, where the glitch correction circuit 1080 includes the integer boundary crossing detector 581 and a filter 1083.

In operation, the modulator 1070 accepts, as input, the m-bit integer portion 271 and the n-bit fractional portion 272 of the binary 2's complement number presented to the modulator sub-system 1000 and generates a divisor signal 1073. The modulator 1070 provides a fractional multiplication capability by dithering the divisor signal 1073 presented to the adder 1090 to represent both the integer portion and the fractional portion. The values of the divisor signal 1073 supplied to the adder 1090 may vary between two integer values (e.g., N and N+1) in a proportion equivalent to the fractional component $$\frac{K}{F}.$$

Figure 11:
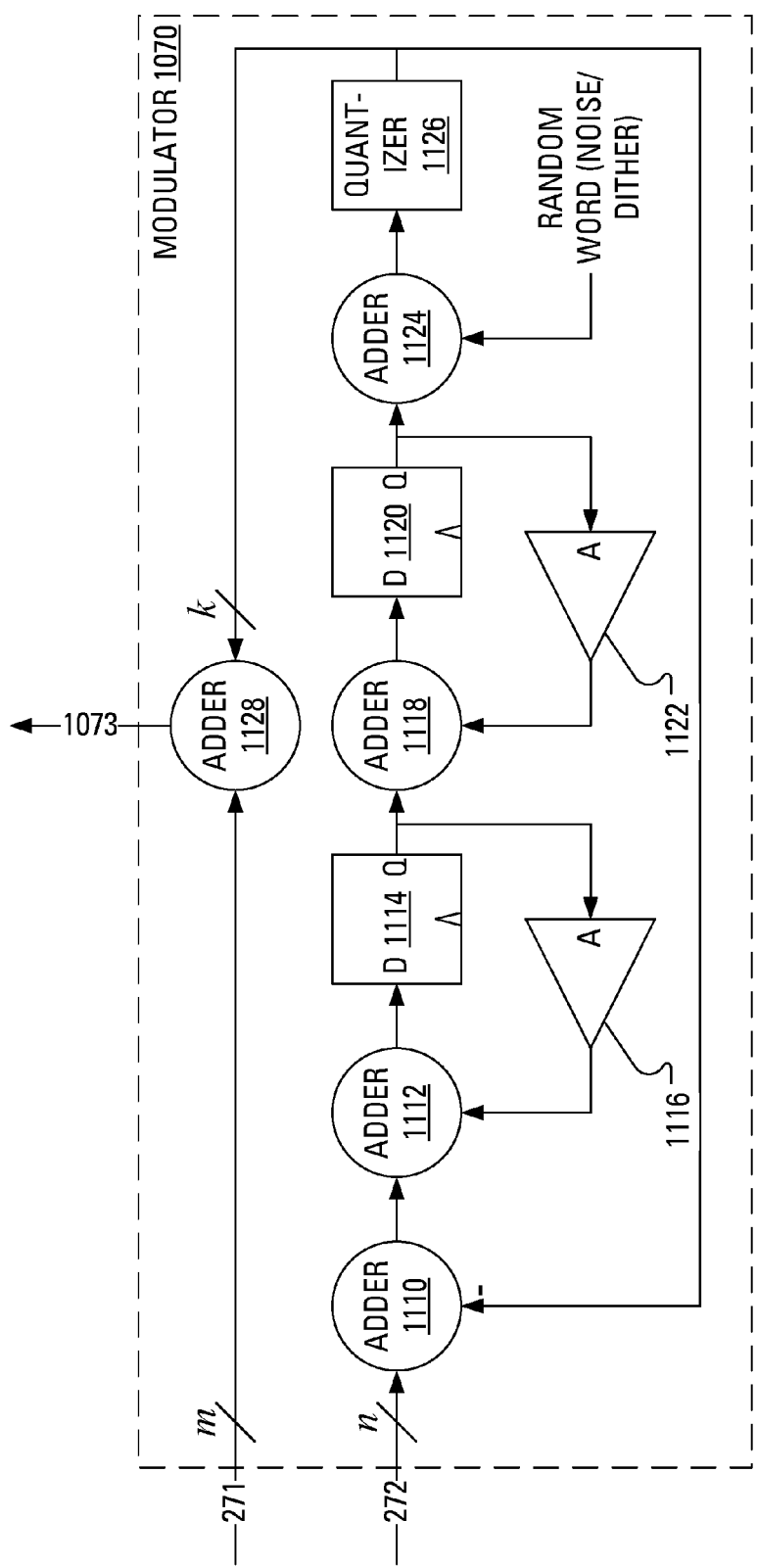
FIG. 11 is a simplified block diagram of an example embodiment of the 2nd order DSM for use in the modulator sub-system shown in FIG. 10.

The modulator 1070 is described in greater detail having regard to the example block diagram shown in FIG. 11. The modulator 1070, which, in FIG. 11, is shown as a $2^{nd}$ order, or dual stage, DSM, includes a feedback adder 1110, which receives the fractional portion 272 input and a feedback signal. The output of the feedback adder 1110 is received at a first-stage adder 1112, whose output is received by a first-stage latch 1114 and which also receives output from a first-stage amplifier 1116, whose input is the output from the first-stage latch 1114. The output of the first-stage latch 1114 is received at a second-stage adder 1118, whose output is received by a second-stage latch 1120 and which also receives output from a second-stage amplifier 1122, whose input is the output from the second-stage latch 1120. The output of the second-stage latch 1120 is received at a noise adder 1124, whose output is passed to a quantizer 1126. The output of the quantizer 1126 is fed back to the feedback adder 1110 and is also passed to an output adder 1128. At the output adder 1128, the integer portion 271 is received as well as the output of the quantizer 1126.

In operation, the input adder subtracts the output of the quantizer 1126 from the fractional portion 272. The first-stage adder 1112 accepts, as input, the output generated by the feedback adder 1110 and the output of the first-stage latch 1114 amplified (with gain A) by the first-stage amplifier 1116. The output of the first-stage adder 1112 is fed into an input of the first-stage latch 1114. The first-stage latch 1114 generates a first-stage output signal that is fed into an input of the second-stage adder 1118 and into the input of the first-stage amplifier 1116.

The second-stage adder 1118 accepts, as input, the output generated by the first-stage latch 1114 and the output of the second-stage latch 1120 amplified (with gain A) by the second-stage amplifier 1122. The output of the second-stage adder 1118 is fed into an input of the first-stage latch 1120. The second-stage latch 1120 generates a second-stage output signal that is fed into an input of the noise adder 1124 and into the input of the second-stage amplifier 1122.

The noise adder 1124 accepts, as input, the output of the second-stage latch 1120 and a random word representing noise and/or dither. The sum generated by the noise adder 1124 is fed into the quantizer 1126. Those having ordinary skill in this art will appreciate that the addition of noise and/or dither to the modulated signal may reduce or eliminate the generation of spurious tones in the sub-system 1000.

The quantizer 1126 accepts, as input, the output generated by the noise adder 1124 and generates a quantizer output signal, which is fed into an input of the feedback adder 1110 and fed forward to the output adder 1128.

The output adder 1128 generates a sum of the output of the quantizer 1126 and the integer portion 271 as the divisor signal 1073 supplied to the adder 1090 (see FIG. 10).

The quantizer 1126 rounds off the received fractional number to generate a binary 2's complement integer value of k bits. In the example scenario of k=3, the output 471 of the quantizer 470 may take on values in the range [−4, −3, −2, −1, 0, 1, 2, 3].

The first-stage components, comprising the first-stage adder 1112, the first-stage latch 1114 and the first-stage amplifier 1116, and the second-stage components, comprising the second-stage adder 1118, the second-stage latch 1120 and the second-stage amplifier 1122, combine to improve, on average, the accuracy of the divisor signal 1073 in a manner well known to those having ordinary skill in this art.

Those having ordinary skill in this art will appreciate that the addition, at the noise adder 1124, of noise and/or dither to the modulated signal may reduce or eliminate the generation of spurious tones in the modulator sub-system 1000 shown in FIG. 10.

While the modulator 1070 is generating the divisor signal 1073, the integer boundary crossing detector 581 accepts, as input, a signal that comprises a subset of the bits representing the fractional portion 272 of the binary 2's complement number presented to the modulator sub-system 800. As discussed above, the two most significant bits (572A, 572B) of the fractional portion 272 constitute the input signal provided to the integer boundary crossing detector 581.

The integer boundary crossing detector 581 generates an output signal that feeds into the filter 1083. The signal output by the integer boundary crossing detector 581 may be one or more single bit signals. As shown in FIG. 10, the integer boundary crossing detector 581 outputs condition detection output 582A, 582B.

The filter 1083 may react to the activation of at least one of the bit signals by outputting a positive correction factor (having a magnitude of 2, in this case). Similarly, the filter 1083 may react to the activation of at least one other bit signal by outputting a negative correction factor (having a magnitude of 2, in this case). The filter 1083 may react to the absence of bit signal activation by outputting a zero correction factor.

Alternatively, the filter 1083 may output a specific 2's complement binary integer to signal a positive correction factor, may output a further 2's complement binary integer to signal a negative correction factor and may output an additional 2's complement binary integer to signal a zero correction factor.

Those having ordinary skill in this art will appreciate that the size of the correction factor output by the filter 1083 should be generally commensurate with the size of the inverse of the response of the modulator 1070, which may or may not be a single specific integer value for all cases. In the example discussed above, an appropriate correction factor is ±2.

The filter 1083 accepts, as input, the condition detection output (582A, 582B) generated by the integer boundary crossing detector 581 and generates a filtered output signal 1084, which feeds into an input of the adder 1090. In one implementation, the filter 883 is a FIR filter. Those having ordinary skill in this art will appreciate that other filters, including IIR filters may be appropriate in some circumstances. However, the use of an IIR filter may introduce significant additional circuit complexity.

In one implementation, the filter 1083 is designed to have an impulse response characteristic that approximately mirrors the impulse response characteristic of the modulator 1070, which models an infinite impulse response. Conveniently, glitch correction may be accomplished by the filter 1083 by way of compensating for a glitch from the modulator 1070 by providing to the adder 1090 an amount at least substantially similar to the glitch but opposite in sign.

If the filter 1083 is an FIR filter, the filter 1083 will not have an impulse response characteristic that exactly mirrors the infinite impulse response characteristic of the modulator 1070. Nevertheless, it has been observed that an FIR filter may provide a sufficiently approximating response for the purposes of glitch correction.

The adder 1090 accepts, as inputs, the divisor signal 1073 generated by the modulator 1070 and the filtered output signal 1084 generated by the filter 1083. The adder 1090 generates the corrected divisor signal 1001, which, when the modulator sub-system 1000 shown in FIG. 10 is used in place of the modulator sub-system 500 shown in FIG. 5 in the fractional-N PLL 400 shown in FIG. 4, feeds into the divider network 260.

Figure 12:
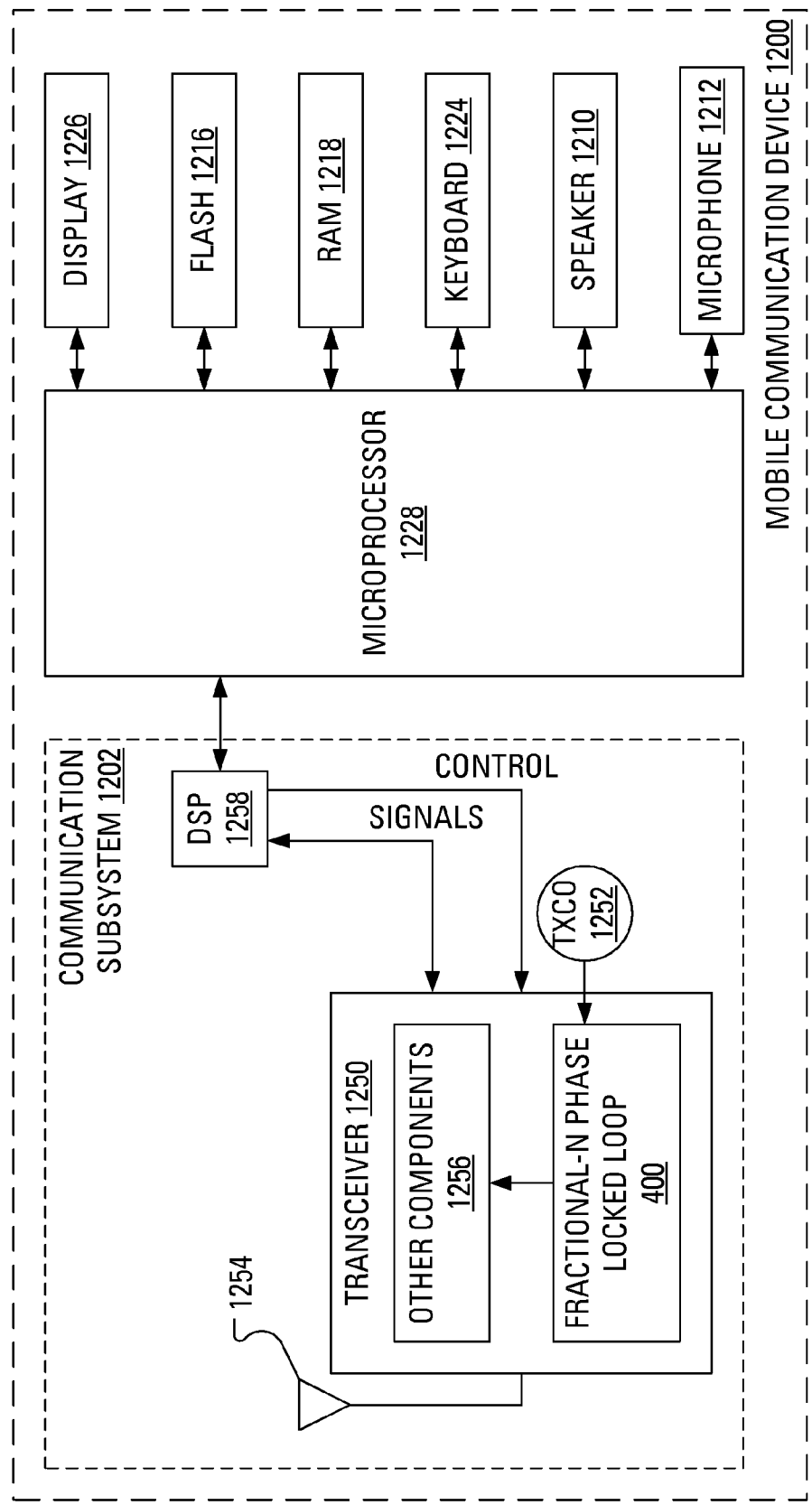
FIG. 12 is a simplified block diagram of an example embodiment of mobile communication device that may make use of the fractional-N PLL of FIG. 4.

FIG. 12 illustrates a mobile communication device 1200 as an example of a device that may employ the fractional-N PLL 400 shown in FIG. 4. The mobile communication device 1200 includes an input device (e.g., a keyboard 1224 having a plurality of keys) and an output device (a display 1226). A processing device (a microprocessor 1228) is shown schematically in FIG. 12 as coupled between the keyboard 1224 and the display 1226. The microprocessor 1228 controls the operation of the display 1226, as well as the overall operation of the mobile communication device 1200, in part, responsive to actuation of the keys on the keyboard 1224 by a user.

In addition to the microprocessor 1228, other parts of the mobile communication device 1200 are shown schematically in FIG. 12. These include: a communications sub-system 1202; the keyboard 1224 and the display 1226, along with a speaker 1210 and a microphone 1212; as well as memory devices including a flash memory 1216 and a Random Access Memory (RAM) 1218. The mobile communication device 1200 may be a two-way radio frequency (RF) communication device having voice and data communication capabilities.

Operating system software executed by the microprocessor 1228 may be stored in a computer readable medium, such as the flash memory 1216, but may be stored in other types of memory devices, such as a read only memory (ROM) or similar storage element. In addition, system software, specific device applications, or parts thereof, may be temporarily loaded into a volatile store, such as the RAM 1218. Communication signals received by the mobile device may also be stored to the RAM 1218.

Communication functions, including data and voice communications, are performed through the communication sub-system 1202. The communication sub-system 1202 includes a transceiver 1250 and an antenna 1254. In addition, the communication sub-system 1202 includes a processing module, such as a digital signal processor (DSP) 1258 and a crystal oscillator 1252. The specific design and implementation of the communication sub-system 1202 is dependent upon the communication network in which the mobile communication device 1200 is intended to operate.

When required network registration or activation procedures have been completed, the mobile communication device 1200 may send and receive communication signals over a wireless carrier network (not shown). Signals received from the wireless carrier network by the antenna 1254 are routed to the transceiver 1250, which provides for signal amplification, frequency down conversion, filtering, channel selection, etc., and may also provide analog to digital conversion. Analog-to-digital conversion of the received signal allows the DSP 1258 to perform more complex communication functions, such as demodulation and decoding. In a similar manner, signals to be transmitted to the wireless carrier network are processed (e.g., modulated and encoded) by the DSP 1258 and are then provided to the transceiver 1250 for digital to analog conversion, frequency up conversion, filtering, amplification and transmission to the wireless carrier network (or networks) via the antenna 1254.

As discussed above, in wireless transceivers, a wide range of frequencies may be used. In order to perform the down-conversion and/or up-conversion operations, the transceiver 1250 employs a stable and accurate frequency source in the form of a crystal oscillator 1252.

The transceiver 1250 also employs the fractional-N PLL 400 shown in FIG. 4 to perform frequency multiplication to generate a desired output frequency as a multiple of a reference frequency. The fractional-N PLL 400 provides output to a set of other transceiver components that perform such functions as signal amplification, frequency down conversion, filtering, channel selection, etc.

In addition to processing communication signals, the DSP 1258 provides for control of the transceiver 1250. For example, gains applied to communication signals in the transceiver 1250 may be adaptively controlled through automatic gain control algorithms implemented in the DSP 1258.

Certain adaptations and modifications of the described embodiments can be made. Therefore, the above discussed embodiments are considered to be illustrative and not restrictive.

What is claimed is:

1. A modulator sub-system for generating a corrected divisor signal for use by a divider network in a fractional-N phase locked loop circuit, said modulator sub-system comprising:
    a modulator arranged to receive an input signal that includes a first plurality of bits and a second plurality of bits and generate, based on said input signal, a divisor signal;
    a correction circuit including:
        a condition detecting circuit arranged to:
            receive a subset of said first plurality of bits;
            detect, based on said subset of said first plurality of bits, a condition wherein said divisor signal is likely to be incorrect; and
            generate a condition detection output indicating said condition;
        a filter arranged to generate a correction signal based on said condition detection output; and
        an adder arranged to form said corrected divisor signal as a sum of said divisor signal and said correction signal.

2. The modulator sub-system of claim 1 wherein said modulator has a modulator impulse response characteristic, said filter has a filter impulse response characteristic and said filter impulse response characteristic approximately mirrors said modulator impulse response characteristic.

3. The modulator sub-system of claim 1, wherein said modulator comprises a delta-sigma modulator.

4. The modulator sub-system of claim 1, wherein said first plurality of bits comprise a 2's complement fractional portion of a desired modulation value.

5. The modulator sub-system of claim 1, wherein said second plurality of bits comprise a 2's complement integer portion of a desired modulation value.

6. The modulator sub-system of claim 1, wherein said condition detecting circuit comprises a plurality of logic elements configured to generate said condition detection output.

7. The modulator sub-system of claim 1, wherein said condition is a positive-going integer boundary crossing.

8. The modulator sub-system of claim 1, wherein said condition is a negative-going integer boundary crossing.

9. A method for correcting an output of a modulator, where said modulator accepts, as input, a plurality of binary modulation values, said method comprising:
    monitoring at least a portion of said plurality of binary modulation values;
    recognizing, responsive to said monitoring, a condition wherein output of said modulator is likely to be incorrect due to differing propagation rates of said plurality of binary modulation values through said modulator;
    generating, responsive to said recognizing, a correction factor; and
    adding said correction factor to said output of said modulator.

10. The method of claim 9 wherein said modulator has a modulator impulse response characteristic, said generating is performed according to a filter impulse response characteristic and said filter impulse response characteristic approximately mirrors said modulator impulse response characteristic.

11. The method of claim 9 wherein said modulator comprises a delta-sigma modulator.

12. The method of claim 9 wherein said plurality of bits comprise a 2's complement fractional portion of a desired modulation value.

13. The method of claim 9 wherein said condition is a positive-going integer boundary crossing.

14. The method of claim 9 wherein said condition is a negative-going integer boundary crossing.

15. A fractional-N phase locked loop comprising:
    a voltage controlled oscillator for generating a phase locked loop output signal with a frequency based on a received bias signal;
    a divider circuit adapted to generate a reference signal based on a source signal received from a frequency source;
    a divider network for generating a feedback signal having a frequency that is a quotient obtained by dividing said frequency of said phase locked loop output signal by an integer divisor;
    a phase frequency detector for generating phase control signals based on a difference between said feedback signal and said reference signal; and
    a modulator sub-system for providing said integer divisor to said divider network, said modulator sub-system including:
        a modulator arranged to receive an input signal that includes a first plurality of bits and a second plurality of bits and generate, based on said input signal, a divisor signal;
        a correction circuit including a condition detecting circuit and a filter, said condition detecting circuit arranged to receive a subset of said first plurality of bits, detect, based on said subset of said first plurality of bits, a condition wherein said divisor signal is likely to be incorrect and generate a condition detection output indicating said condition, said filter arranged to generate a correction signal based on said condition detection output; and an adder arranged to form said integer divisor, for use in said divider network, as a sum of said divisor signal and said correction signal.

16. A mobile device comprising:

an antenna;

a crystal oscillator;

a transceiver communicatively connected to said antenna for transmitting and receiving, said transceiver including a fractional-N phase locked loop including:

a voltage controlled oscillator for generating a phase locked loop output signal with a frequency based on a received bias signal;

a divider circuit adapted to generate a reference signal based on a source signal received from said crystal oscillator;

a divider network for generating a feedback signal having a frequency that is a quotient obtained by dividing said frequency of said phase locked loop output signal by an integer divisor;

a phase frequency detector for generating phase control signals based on a difference between said feedback signal and said reference signal; and a modulator sub-system for providing said integer divisor to said divider network, said modulator sub-system including:

a modulator arranged to receive an input signal that includes a first plurality of bits and a second plurality of bits and generate, based on said input signal, a divisor signal;

a correction circuit including a condition detecting circuit and a filter, said condition detecting circuit arranged to receive a subset of said first plurality of bits, detect, based on said subset of said first plurality of bits, a condition wherein said divisor signal is likely to be incorrect and generate a condition detection output indicating said condition, said filter arranged to generate a correction signal based on said condition detection output; and an adder arranged to form said integer divisor, for use in said divider network, as a sum of said divisor signal and said correction signal.

* * * * *